(12) United States Patent
Sato et al.

(10) Patent No.: US 8,604,842 B2
(45) Date of Patent: Dec. 10, 2013

(54) HIGH-SIDE SWITCH CIRCUIT

(75) Inventors: Yuki Sato, Tokyo (JP); Hiroyuki Tsurumi, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/425,606

(22) Filed: Mar. 21, 2012

(65) Prior Publication Data
US 2013/0049813 A1 Feb. 28, 2013

(30) Foreign Application Priority Data

Aug. 24, 2011 (JP) ................. 2011-182974

(51) Int. Cl.
*H03K 3/00* (2006.01)
*H03K 5/153* (2006.01)
(52) U.S. Cl.
USPC ............. 327/108; 327/77; 327/427; 323/315
(58) Field of Classification Search
USPC ......... 327/108–112, 375, 538–543, 427, 379, 327/387–389, 77–78, 80–81, 309–312, 327/63–76, 79, 82–89; 323/311–317, 282, 323/284, 285, 265
See application file for complete search history.

(56) References Cited

U.S. PATENT DOCUMENTS

| | | | | |
|---|---|---|---|---|
| 5,006,791 A | * | 4/1991 | Cross | ............................ 324/133 |
| 5,973,551 A | * | 10/1999 | Mitsuda | ........................ 327/543 |
| 7,212,036 B2 | * | 5/2007 | Kasuya et al. | ................... 326/83 |
| 7,375,589 B2 | | 5/2008 | Yasuda et al. | |
| 7,408,398 B2 | * | 8/2008 | Sander | ......................... 327/427 |
| 7,696,827 B2 | | 4/2010 | Yasuda et al. | |
| 7,728,655 B2 | * | 6/2010 | Ng et al. | ......................... 327/543 |
| 7,960,997 B2 | * | 6/2011 | Williams | ................. 324/762.09 |
| 8,390,558 B2 | * | 3/2013 | Lee et al. | ......................... 345/99 |

FOREIGN PATENT DOCUMENTS

JP 03-283804 12/1991

* cited by examiner

*Primary Examiner* — Lincoln Donovan
*Assistant Examiner* — Thomas Skibinski
(74) *Attorney, Agent, or Firm* — Oblon, Spivak, McClelland, Maier & Neustadt, L.L.P.

(57) ABSTRACT

The high-side switch circuit includes a first output MOS transistor that is connected, at a first end thereof, to a power supply terminal. The high-side switch circuit includes a second output MOS transistor that is connected to a second end of the first output MOS transistor at a first end thereof and to a voltage output terminal at a second end thereof. The high-side switch circuit includes a current detecting circuit that detects a current flowing through the first output MOS transistor and outputs a detection signal. The high-side switch circuit includes a first gate driver that applies a first control voltage to a gate of the first output MOS transistor. The high-side switch circuit includes a second gate driver that applies a second control voltage to a gate of the second output MOS transistor.

7 Claims, 6 Drawing Sheets

HIGH-SIDE SWITCH CIRCUIT

CROSS-REFERENCE TO RELATED APPLICATION

This application is based upon and claims the benefit of priority from the prior Japanese Patent Application No. 2011-182974, filed on Aug. 24, 2011, the entire contents of which are incorporated herein by reference.

BACKGROUND

1. Field

Embodiments described herein relate generally to a high-side switch circuit.

2. Background Art

High-side switches are used for output switching of an onboard power supply circuit, for example.

DETAILED DESCRIPTION

A high-side switch circuit according to an embodiment switches and outputs a power supply voltage. The high-side switch circuit includes a first output MOS transistor that is connected, at a first end thereof, to a power supply terminal to which the power supply voltage is applied. The high-side switch circuit includes a second output MOS transistor that is connected to a second end of the first output MOS transistor at a first end thereof and to a voltage output terminal at a second end thereof. The high-side switch circuit includes a current detecting circuit that detects a current flowing through the first output MOS transistor and outputs a detection signal based on the result of the detection. The high-side switch circuit includes a first gate driver that applies a first control voltage to a gate of the first output MOS transistor so as to make the first output MOS transistor operate in a linear region. The high-side switch circuit includes a second gate driver that applies a second control voltage to a gate of the second output MOS transistor so as to make the second output MOS transistor operate in a linear region.

The first gate driver applies the first control voltage to the gate of the first output MOS transistor in response to the detection signal so as to limit the current flowing through the first output MOS transistor when the current flowing through the first output MOS transistor exceeds a preset threshold.

COMPARATIVE EXAMPLES

In the following, comparative examples against which an embodiment is compared will be described.

A circuit product designed for onboard use is subjected to a ground fault test, for example.

The ground fault test involves turning on the power supply when the output of the circuit product is short-circuited to the ground or short-circuiting the output of the circuit product to the ground when the power supply is on. The circuit product designed for onboard use is required to endure the severe conditions imposed in the ground fault test.

Figure 1:
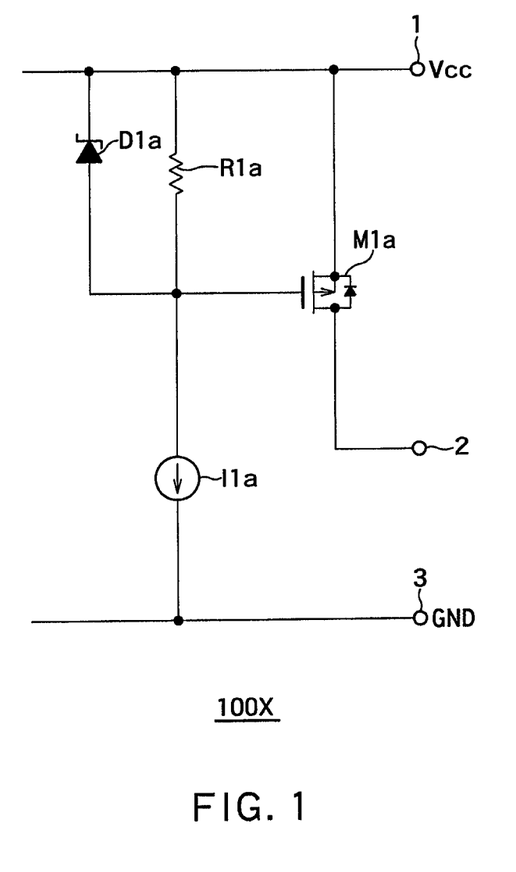
FIG. 1 is a circuit diagram showing a circuit configuration of a high-side switch circuit 100X according to a first comparative example.

FIG. 1 is a circuit diagram showing a circuit configuration of a high-side switch circuit 100X according to a first comparative example.

As shown in FIG. 1, the high-side switch circuit 100X does not have a cascode structure.

In the high-side switch circuit 100X, the whole of the voltage applied between a power supply terminal 1 and an output terminal is applied between the drain and a source of a double diffused MOS (DMOS) transistor M1a. Therefore, in a load dump test (LDT), which involves applying high voltage to the power supply terminal 1, the breakdown tolerance depends on the withstand voltage between the drain and the source of the transistor M1a.

It is known that a secondary breakdown occurs because of operation of a parasitic bipolar transistor in the DMOS transistor. The allowable dissipation "Pd", which is represented by the product of the drain-source voltage and the drain current, is smaller in a region where the drain-source voltage is higher than in a region where the drain-source voltage is lower because of the secondary breakdown.

That is, the high-side switch circuit 100X having no cascode structure is likely to be broken when a high drain-source voltage is applied, because the secondary breakdown occurs, and the allowable dissipation decreases.

Figure 2:
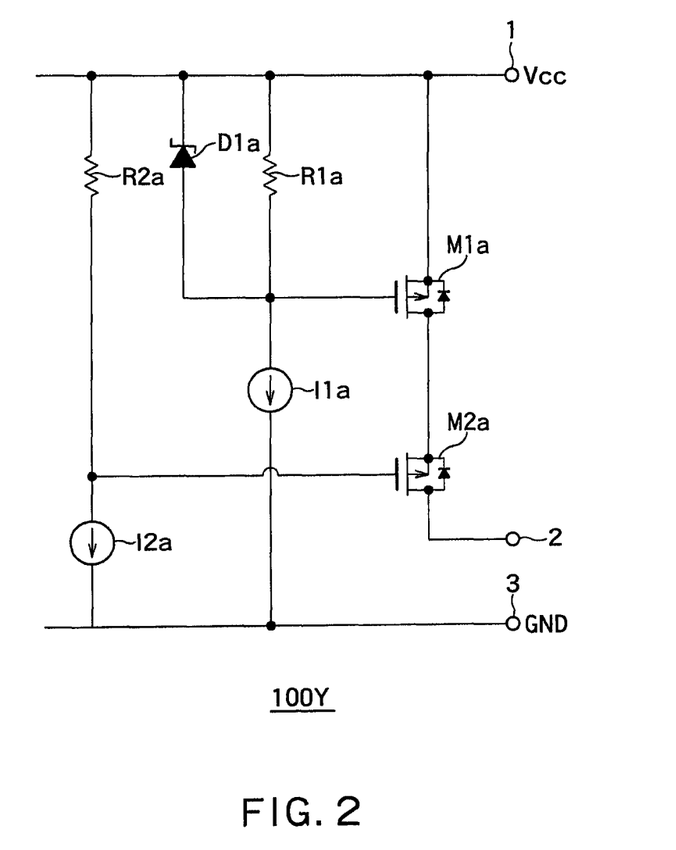
FIG. 2 is a circuit diagram showing a circuit configuration of a high-side switch circuit 100Y according to the second Comparative Example.

Next, a high-side switch circuit having a cascode structure according to a second Comparative Example will be described. FIG. 2 is a circuit diagram showing a circuit configuration of a high-side switch circuit 100Y according to the second Comparative Example.

The high-side switch circuit 100Y shown in FIG. 2 is driven with the gate-source voltages of two DMOS transistors M1a and M2a fixed at appropriate values.

In the ground fault test of the high-side switch circuit 100Y having such a structure, the source is short-circuited to the ground with the gate voltage of the DMOS transistor M2a fixed. That is, a high voltage is applied between the drain and the source of the DMOS transistor M2a.

Considering a safe operating area (SOA) curve, the higher the drain-source voltage, the lower the current at which the DMOS transistor is broken is. Although the DMOS transistors M1a and M2a are cascode connected, if the output terminal is grounded, the drain-source voltage of the DMOS transistor M2a rises whereas the drain-source voltage of the DMOS transistor M1a is kept low. Nevertheless, the currents flowing through the DMOS transistors M1a and M2a are not changed, so that the dissipation is higher in the DMOS transistor M2a than in the DMOS transistor M1a. Thus, although the high-side switch circuit has a cascode structure, there is still a problem of nonuniform dissipation when ground fault occurs.

As can be seen from the above description, the DMOS transistor M2a is likely to be broken when a high voltage is applied between the drain and the source of the DMOS transistor M2a in the ground fault test.

Figure 3:
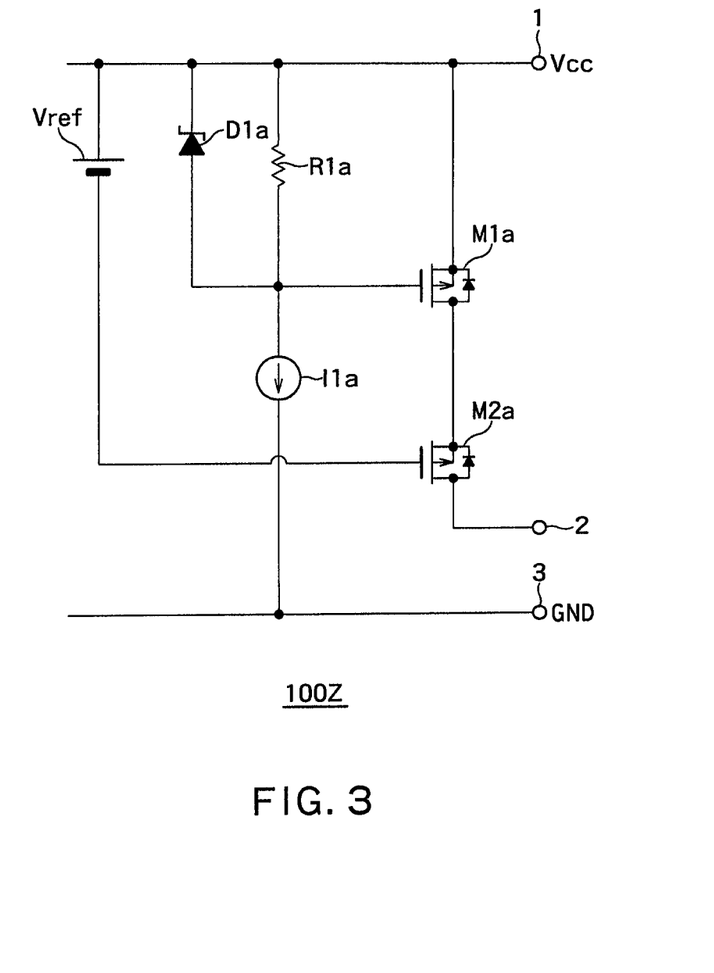
FIG. 3 is a circuit diagram showing a circuit configuration of a high-side switch circuit 100Z according to the third Comparative Example.

Next, a high-side switch circuit having a cascode structure according to a third Comparative Example will be described. FIG. 3 is a circuit diagram showing a circuit configuration of a high-side switch circuit 100Z according to the third Comparative Example.

The high-side switch circuit 100Z shown in FIG. 3 is improved in breakdown tolerance by fixing the gate potential of a DMOS transistor M2a at a reference voltage "Vref" and fixing the source potential of the DMOS transistor M2a at approximately a half of the power supply voltage.

With the high-side switch circuit 100Z, the drain-source voltages of upper and lower DMOS transistors M1a and M2a are approximately equal to each other. Therefore, the high-side switch circuit 100Z can be improved in breakdown tolerance.

However, the source potential of the DMOS transistor M2a in the high-side switch circuit 100Z is also fixed at approximately a half of the power supply voltage in the normal operation. In other words, the high-side switch circuit 100Z can only provide the reduced output in the normal operation and cannot meet the functional requirements.

As described above, the high-side switch circuits 100X to 100Z according to the Comparative Examples have a problem that the high-side switch circuits cannot be improved in breakdown tolerance while remaining capable of achieving a predetermined switching operation.

In view of such circumstances, a high-side switch circuit that is improved in breakdown tolerance while remaining capable of achieving a predetermined switching operation will be proposed below with reference to an embodiment.

In the following, the embodiment will be described with reference to the drawings.

First Embodiment

Figure 4:
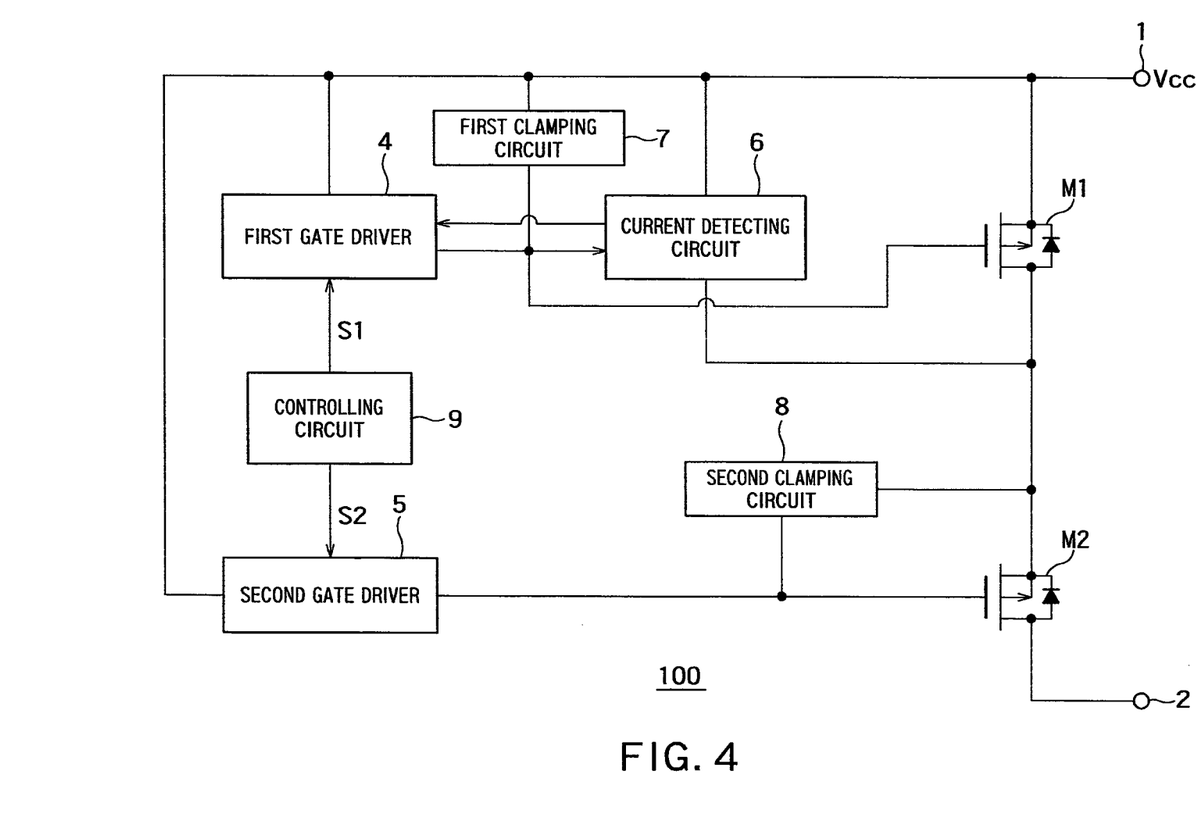
FIG. 4 is a block diagram showing a configuration of a high-side switch circuit 100 according to a first embodiment.

FIG. 4 is a block diagram showing a configuration of a high-side switch circuit 100 according to a first embodiment.

As shown in FIG. 4, the high-side switch circuit 100 includes a power supply terminal 1, a voltage output terminal 2, a first gate driver 4, a second gate driver 5, a current detecting circuit 6, a first clamping circuit 7, a second clamping circuit 8, a controlling circuit 9, a first output MOS transistor (pMOS transistor) M1, and a second output MOS transistor (pMOS transistor) M2.

The power supply terminal 1 is connected to a power supply (not shown), which supplies a power supply voltage "Vcc" to the power supply terminal 1.

The voltage output terminal 2 is configured to be connected to a load (not shown).

The first output MOS transistor M1 is connected at one end (source) thereof to the power supply terminal 1 to which the power supply voltage "Vcc" is applied. The first output MOS transistor M1 is a DMOS transistor, for example.

The second output MOS transistor M2 is connected to another end (drain) of the first output MOS transistor M1 at one end (source) thereof and to the voltage output terminal 2 at another end (drain) thereof. The second output MOS transistor M2 is a DMOS transistor, for example.

The second output MOS transistor M2 is configured to have the same size as the first output MOS transistor M1, for example.

The current detecting circuit 6 is configured to detect the current flowing through the first output MOS transistor M1 and output a detection signal Sd based on the result of the detection. For example, the current detecting circuit 6 outputs different detection signals Sd based on whether the current flowing through the first output MOS transistor M1 exceeds a preset threshold or not.

The first gate driver 4 is configured to apply a first control voltage to the gate of the first output MOS transistor M1 so that the first output MOS transistor M1 operates in a linear region.

According to the detection signal Sd, when the current flowing through the first output MOS transistor M1 exceeds the preset threshold, the first gate driver 4 applies a first control voltage to the gate of the first output MOS transistor M1 to limit the current flowing through the first output MOS transistor M1.

The second gate driver 5 is configured to apply a second control voltage to the gate of the second output MOS transistor M2 so that the second output MOS transistor M2 operates in a linear region. For example, the second gate driver 5 sets the second control voltage to be a half of the power supply voltage "Vcc".

The first clamping circuit 7 is connected between one end (source) and the gate of the first output MOS transistor M1. The first clamping circuit 7 is configured to clamp the voltage between the one end (source) and the gate of the first output MOS transistor M1 so as to prevent the voltage from exceeding a gate withstand voltage of the first output MOS transistor M1.

The second clamping circuit 8 is connected between one end (source) and the gate of the second output MOS transistor M2. The second clamping circuit 8 is configured to clamp the voltage between the one end (source) and the gate of the second output MOS transistor M2 so as to prevent the voltage from exceeding a gate withstand voltage of the second output MOS transistor M2.

The controlling circuit 9 is configured to control the operations of the first and second gate drivers 4 and 5 with a first control signal S1 and a second control signal S2.

For example, in a stand-by state, the controlling circuit 9 controls the first gate driver 4 with the first control signal S1 to turn off the first output MOS transistor M1 and controls the second gate driver 5 with the second control signal S2 to turn off the second output MOS transistor M2.

As a result, the power supply terminal 1 and the voltage output terminal 2 are disconnected, and the power supply voltage "Vcc" is not output from the voltage output terminal 2.

On the other hand, for example, when the stand-by state is released, the controlling circuit 9 controls the first gate driver 4 with the first control signal S1 to turn on the first output MOS transistor M1 (or to make the first output MOS transistor M1 operate in the linear region) and controls the second gate driver 5 with the second control signal S2 to turn on the second output MOS transistor M2 (or to make the second output MOS transistor M2 operate in the linear region).

As a result, the power supply terminal 1 and the voltage output terminal 2 are connected, and the power supply voltage "Vcc" is output from the voltage output terminal 2.

Alternatively, the controlling circuit 9 may be provided outside of the high-side switch circuit 100.

As described above, the high-side switch circuit 100 is configured to output, at the voltage output terminal 2, the power supply voltage "Vcc" supplied to the power supply terminal 1 by switching the two MOS transistors M1 and M2 cascode-connected to each other.

Figure 5:
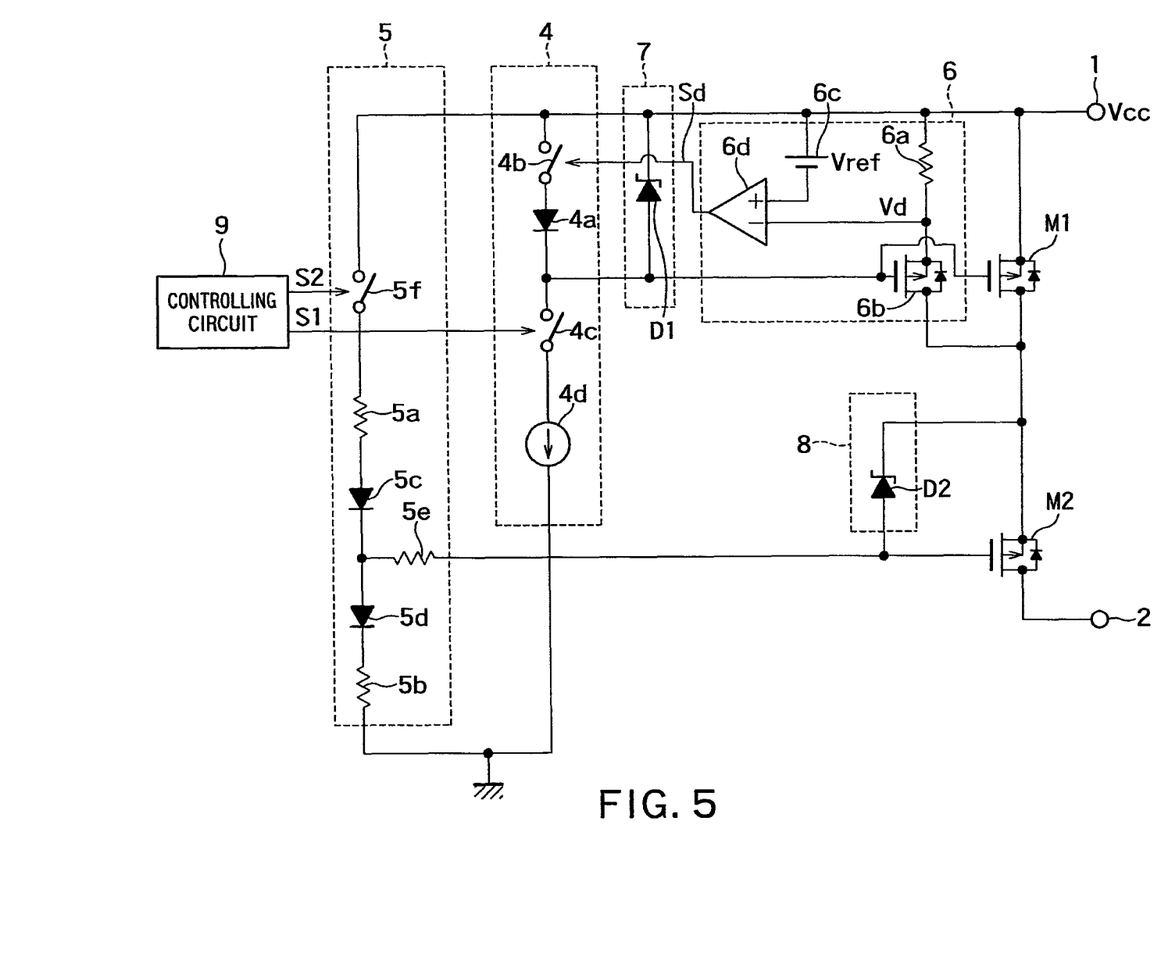
FIG. 5 is a diagram showing an example of a specific circuit configuration of the blocks forming the high-side switch circuit 100 shown in FIG. 4.

FIG. 5 is a diagram showing an example of a specific circuit configuration of the blocks forming the high-side switch circuit 100 shown in FIG. 4.

As shown in FIG. 5, the first clamping circuit 7 includes a first Zener diode D1 connected to one end (source) of the first output MOS transistor M1 at the cathode thereof and to the gate of the first output MOS transistor M1 at the anode thereof, for example.

The second clamping circuit 8 includes a second Zener diode D2 connected to one end (source) of the second output MOS transistor M2 at the cathode thereof and to the gate of the second output MOS transistor M2 at the anode thereof, for example.

The current detecting circuit 6 includes a detecting resistor 6a, a detecting MOS transistor 6b, a reference voltage generating circuit 6c and a comparator 6d.

The detecting resistor 6a is connected to the power supply terminal 1 at one end thereof.

The detecting MOS transistor 6b is connected to the other end of the detecting resistor 6a at one end thereof, to another end of the first output MOS transistor M1 at another end thereof and to the gate of the first output MOS transistor M1 at the gate thereof.

In this example, the detecting MOS transistor 6b is of the same conductivity type as the first output MOS transistor M1 (that is, the detecting MOS transistor 6b is a pMOS transistor). In addition, the detecting MOS transistor 6b has the same threshold voltage as the first output MOS transistor M1, for example. In addition, the detecting MOS transistor 6b is configured to have a smaller size than the first output MOS transistor M1 in order to reduce the current consumption for detection.

The reference voltage generating circuit 6c is configured to generate a reference voltage "Vref" that is lower than the voltage at the power supply terminal 1 (power supply voltage "Vcc") by a predetermined value.

The comparator 6d is configured to compare the detected voltage "Vd" between the other end of the detecting resistor 6a and the one end of the detecting MOS transistor 6b with the reference voltage "Vref" and output the detection signal Sd according to the result of the comparison.

The current flowing through the detecting MOS transistor (detecting resistor 6a) varies with the current flowing through the first output MOS transistor M1. In other words, the detected voltage "Vd" varies with the current flowing through the first output MOS transistor M1. Therefore, the current flowing through the first output MOS transistor M1 can be indirectly detected by determining the detected voltage "Vd".

Thus, the reference voltage "Vref" is set at a value based on the threshold described above. This enables the current flowing through the first output MOS transistor M1 to be indirectly compared with the threshold by comparison between the reference voltage "Vref" and the detected voltage "Vd".

That is, the detection signal Sd output from the comparator 6d includes the result of indirect comparison between the threshold and the current flowing through the first output MOS transistor M1.

For example, if the current flowing through the first output MOS transistor M1 is higher than the threshold, the detected voltage "Vd" is lower than the reference voltage "Vref". On the other hand, if the current flowing through the first output MOS transistor M1 is lower than the threshold, the detected voltage "Vd" is higher than the reference voltage "Vref".

As shown in FIG. 5, the first gate driver 4 includes a first diode 4a, a first switch circuit 4b, a second switch circuit 4c and a first constant current source 4d.

The first diode 4a is forward-connected between the power supply terminal 1 and the gate of the first output MOS transistor M1.

The first switch circuit 4b is connected in series to the first diode between the power supply terminal 1 and the gate of the first output MOS transistor M1. The first switch circuit 4b is turned on and off under the control of the detection signal Sd output from the comparator 6d.

For example, the first switch circuit 4b is turned on in response to the detection signal Sd when the current flowing through the first output MOS transistor M1 exceeds the preset threshold, and is turned off in response to the detection signal Sd when the current flowing through the first output MOS transistor M1 does not exceed the preset threshold.

The first constant current source 4d is connected between the gate of the first output MOS transistor M1 and the ground and supplies a constant current.

The second switch circuit 4c is connected in series to the first constant current source 4d between the gate of the first output MOS transistor M1 and the ground. The second switch circuit 4c is turned on and off under the control of the controlling circuit 9.

In the stand-by state, the second switch circuit 4c is kept in the off state by the first control signal S1. When the stand-by state is released (for normal operation or ground fault test), the second switch circuit 4c is turned on by the first control signal S1.

As shown in FIG. 5, the second gate driver 5 includes a first voltage dividing resistor 5a, a second voltage dividing resistor 5b, a first diode 5c, a second diode 5d, a protective resistor 5e and a third switch circuit 5f.

The first voltage dividing resistor 5a is connected to the power supply terminal 1 (via the third switch circuit 5a) at one end thereof and to the gate of the second output MOS transistor M2 (via the first diode 5c and the protective resistor 5e) at the other end thereof.

The second voltage dividing resistor 5b is connected to the other end of the first voltage dividing resistor at one end thereof and to the ground at the other end thereof.

The first diode 5c is connected to the other end of the first voltage dividing resistor 5a at the anode thereof.

The second diode 5d is connected to the cathode of the first diode 5c at the anode thereof and to the one end of the second voltage dividing resistor 5b at the cathode thereof.

The protective resistor 5e is connected to the cathode of the first diode 5c at one end thereof and to the gate of the second output MOS transistor M2 at the other end thereof.

The third switch circuit 5f is connected between the power supply terminal 1 and the one end of the first voltage dividing resistor 5a. The third switch circuit 5f is turned on and off under the control of the controlling circuit 9.

In the stand-by state, the third switch circuit 5f is kept in the off state by the second control signal S2. When the stand-by state is released (for normal operation or ground fault test), the third switch circuit 5f is turned on by the second control signal S2.

Figure 6:
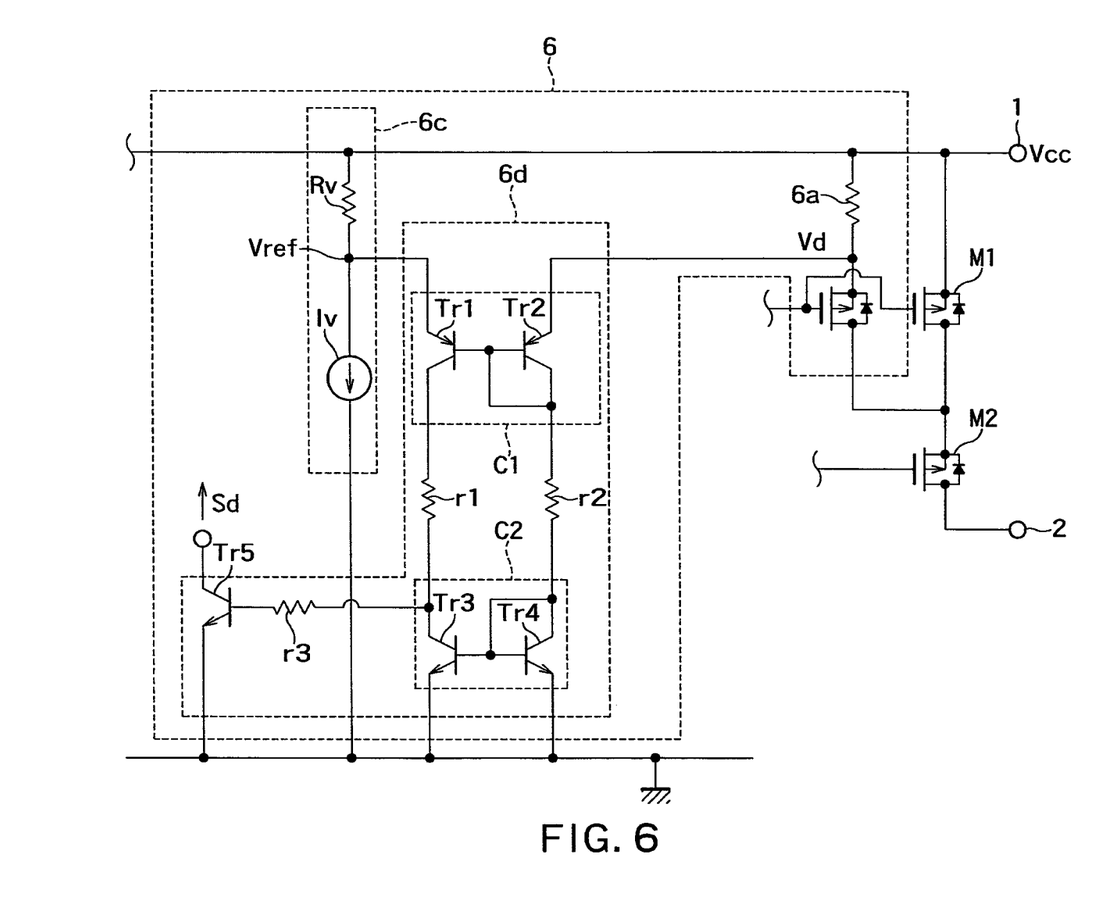
FIG. 6 is a diagram showing an example of a more specific circuit configuration of the current detecting circuit 6 shown in FIG. 5.

FIG. 6 is a diagram showing an example of a more specific circuit configuration of the current detecting circuit 6 shown in FIG. 5.

As shown in FIG. 6, the comparator 6d includes a first bipolar transistor Tr1, a second bipolar transistor Tr2, a third bipolar transistor Tr3, a fourth bipolar transistor Tr4, a fifth bipolar transistor Tr5, a first resistor r1, a second resistor r2 and a third resistor r3.

The reference voltage "Vref" is applied to one end (emitter) of the first bipolar transistor Tr1.

The second bipolar transistor Tr2 is connected to the other end of the detecting resistor 6a at one end (emitter) thereof and to a control terminal (base) of the first bipolar transistor Tr1 at a control terminal (base) thereof. The second bipolar transistor Tr2 is diode-connected.

That is, the first bipolar transistor Tr1 and the second bipolar transistor Tr2 form a first current mirror circuit C1.

For example, the first bipolar transistor Tr1 is configured to have the same size as the second bipolar transistor Tr2.

The third bipolar transistor Tr3 is connected to another end (collector) of the first bipolar transistor Tr1 (via the first resistor r1) at one end (collector) thereof and to the ground at another end (emitter) thereof, and forms a second current mirror circuit C2.

The fourth bipolar transistor Tr4 is connected to the another end (collector) of the second bipolar transistor Tr2 (via the second resistor r2) at one end (collector) thereof and to a control terminal (base) of the third bipolar transistor Tr3 at a control terminal (base) thereof. The fourth bipolar transistor Tr4 is diode-connected.

That is, the third bipolar transistor Tr3 and the fourth bipolar transistor Tr4 form the second current mirror circuit C2.

For example, the third bipolar transistor Tr3 is configured to have the same size as the fourth bipolar transistor Tr4.

The fifth bipolar transistor Tr5 is connected to a terminal at which the detection signal Sd is output at one end, to the ground at another end thereof and to the another end of the third bipolar transistor Tr3 at a control terminal (base) thereof.

The first resistor r1 is connected between another end (collector) of the first bipolar transistor Tr1 and the one end (collector) of the third bipolar transistor Tr3.

The second resistor r2 is connected between another end (emitter) of the second bipolar transistor Tr2 and the one end (collector) of the fourth bipolar transistor Tr4.

For example, the first resistor r1 has the same resistance as the second resistor r2.

The third resistor r3 is connected between another end (collector) of the first bipolar transistor Tr1 and the control terminal (base) of the fifth bipolar transistor Tr5.

As shown in FIG. 6, the reference voltage generating circuit 6c includes a reference resistor Rv and a reference constant current source Iv.

The reference resistor Rv is connected to the power supply terminal 1 at one end thereof.

The reference constant current source Iv is connected between the other end of the reference resistor Rv and the ground and is configured to supply a constant current.

The reference voltage generating circuit 6c is configured to output the voltage between the reference resistor Rv and the reference constant current source Iv as the reference voltage "Vref".

Now, an operation of the comparator 6 configured as described above will be described.

For example, in the normal operation, if the current flowing through the first output MOS transistor M1 does not exceed the threshold, the detected voltage "Vd" is higher than the reference voltage "Vref". As a result, a slightly larger amount of current flows through the second bipolar transistor Tr2 than through the first bipolar transistor Tr1.

The third bipolar transistor Tr3 and the fourth bipolar transistor Tr4 connected to each other in a current mirror configuration have equal emitter currents (provided that the transistors have the same size as described above).

Therefore, no base current flows through the fifth bipolar transistor Tr5, and the fifth bipolar transistor Tr5 is kept in the off state.

As a result, the detection signal Sd output from the comparator is at a "High" level.

On the other hand, if the current flowing through the first output MOS transistor M1 increases, such as in the ground fault test, the current flowing through the detecting MOS transistor 6b also increases.

Then, when the voltage drops in the reference resistor Rv and the detecting resistor 6a become equal to each other (or the reference voltage "Vref" and the detected voltage "Vd" become equal to each other), the currents flowing through the first bipolar transistor Tr1 and the second bipolar transistor Tr2 also become equal to each other.

When the current flowing through the first output MOS transistor M1 further increases to exceed the threshold, the current flowing through the detecting MOS transistor 6a also further increases. As a result, the detected voltage "Vd" becomes lower than the reference voltage "Vref", and the current flowing through the second bipolar transistor Tr2 becomes smaller than the current flowing through the first bipolar transistor Tr1.

As described above, equal currents flow through the third bipolar transistor Tr3 and the fourth bipolar transistor Tr4, which form a current mirror. Therefore, the extra current flows to the base of the fifth bipolar transistor Tr5, thereby turning on the fifth bipolar transistor Tr5.

As a result, the detection signal Sd output from the comparator changes to a "Low" level.

In the example shown in FIG. 6, the transistors forming the comparator 6 have been described as bipolar transistors. However, the transistors forming the comparator 6 may be MOS transistors. In this case, the control terminal corresponds to the gate of the MOS transistor. A PNP bipolar transistor is replaced by a pMOS transistor, and an NPN bipolar transistor is replaced by an nMOS transistor.

Next, an example of an operation of the high-side switch circuit 100 configured as described above and effects and advantages thereof will be described.

First, when the stand-by state is released, the second and third switch circuits 4c and 5f are turned on by the first and second control signals S1 and S2.

Then, the current detecting circuit 6 detects the current flowing through the first output MOS transistor M1 and outputs the detection signal Sd to turn on the first switch circuit 4b when the current flowing through the first output MOS transistor M1 exceeds the preset threshold.

When the first switch circuit 4b is turned on, the gate-source voltage of the first output MOS transistor M1 is clamped by the diode 4a. The clamping voltage is set to be lower than the breakdown voltage of the first Zener diode D1.

Since the gate-source voltage of the first output MOS transistor M1 is fixed at a lower voltage as described above, the current flowing through the first output MOS transistor M1 is limited. At the same time, the current flowing through the second output MOS transistor M2 is also limited. As a result, the gate-source voltage of the second output MOS transistor M2 is lower than the on-voltage of the second Zener diode D2. As a result, the second Zener diode D2 is turned off.

Thus, the gate potential of the second output MOS transistor M2 is determined by the ratio between the resistances of the first voltage dividing resistor 5a and the second voltage dividing resistor 5b. As described above, the resistances of the first voltage dividing resistor 5a and the second voltage dividing resistor 5b are set to be equal to each other, for example. Therefore, the gate potential of the second output MOS transistor M2 can be fixed at approximately a half of the power supply voltage "Vcc".

That is, if there is a possibility of the high-side switch circuit 100 being broken because of a ground fault or the like, the high-side switch circuit 100 makes the drain-source voltages of the first output MOS transistor M1 and the second output MOS transistor M2 equal to each other.

Considering the SOA curve, on conditions that the MOS transistors are not broken, only low current can flow through the MOS transistor when the drain-source voltage is high, although high current can flow through the MOS transistor when the drain-source voltage is low.

That is, if the two MOS transistors cascode-connected to each other have different drain-source voltages, the MOS transistor having the higher drain-source voltage is likely to be unable to endure the excessive current and be broken.

To avoid this, according to this embodiment, if there is a possibility of breakage because of a ground fault or the like, the intermediate potential of the two MOS transistors is fixed at approximately a half of the power supply voltage.

In this way, the difference in drain-source voltage in the high-side switch circuit 100 can be prevented, and the high-side switch circuit 100 can be improved in withstand voltage without affecting the normal operation thereof.

As described above, the high-side switch circuit according to the first embodiment is improved in breakdown tolerance while remaining capable of achieving a predetermined switching operation.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A high-side switch circuit that switches and outputs a power supply voltage, comprising:
   a first output MOS transistor that is connected, at a first end thereof, to a power supply terminal to which the power supply voltage is applied;
   a second output MOS transistor that is connected to a second end of the first output MOS transistor at a first end thereof and to a voltage output terminal at a second end thereof;
   a current detecting circuit that detects a current flowing through the first output MOS transistor and outputs a detection signal based on the result of the detection;
   a first gate driver that applies a first control voltage to a gate of the first output MOS transistor so as to make the first output MOS transistor operate in a linear region; and
   a second gate driver that applies a second control voltage to a gate of the second output MOS transistor so as to make the second output MOS transistor operate in a linear region,
   wherein the first gate driver applies the first control voltage to the gate of the first output MOS transistor in response to the detection signal so as to limit the current flowing through the first output MOS transistor when the current flowing through the first output MOS transistor exceeds a preset threshold;
   wherein the current detecting circuit comprises:
   a detecting resistor that is connected to the power supply terminal at a first end thereof;
   a detecting MOS transistor that is connected to a second end of the detecting resistor at a first end thereof, to the second end of the first output MOS transistor at a second end thereof and to the gate of the first output MOS transistor at a gate thereof;
   a reference voltage generating circuit that generates a reference voltage that is lower than a voltage at the power supply terminal by a predetermined value; and
   a comparator that compares the reference voltage and a detected voltage between the second end of the detecting resistor and the first end of the detecting MOS transistor and outputs a detection signal determined by the result of the comparison, and
   wherein the comparator comprises:
   a first transistor to a first end of which the reference voltage is applied that forms a first current mirror circuit;
   a second transistor that is connected to the second end of the detecting resistor at a first end thereof and to a control terminal of the first transistor at a control terminal thereof and forms the first current mirror circuit;
   a third transistor that is connected to a second end of the first transistor at a first end thereof and to a ground at a second end thereof and forms a second current mirror circuit;
   a fourth transistor that is connected to a second end of the second transistor at a first end thereof and to a control terminal of the third transistor at a control terminal thereof and forms the second current mirror circuit; and
   a fifth transistor that is connected, at a first end thereof, to a terminal at which the detection signal of the comparator is output, to the ground at a second end thereof and to the first end of the third transistor at a control terminal thereof.

2. The high-side switch circuit according to claim 1, further comprising:
   a first clamping circuit that is connected between the first end and the gate of the first output MOS transistor and clamps a voltage between the first end and the gate of the first output MOS transistor so that the voltage between the first end and the gate of the first output MOS transistor does not exceed a gate withstand voltage of the first output MOS transistor; and
   a second clamping circuit that is connected between the first end and the gate of the second output MOS transistor and clamps a voltage between the first end and the gate of the second output MOS transistor so that the voltage between the first end and the gate of the second output MOS transistor does not exceed a gate withstand voltage of the second output MOS transistor.

3. The high-side switch circuit according to claim 2, wherein the first clamping circuit comprises a first Zener diode that is connected to the first end of the first output MOS transistor at a cathode thereof and to the gate of the first output MOS transistor at an anode thereof, and
   the second clamping circuit comprises a second Zener diode that is connected to the first end of the second output MOS transistor at a cathode thereof and to the gate of the second output MOS transistor at an anode thereof.

4. The high-side switch circuit according to claim 1, wherein the first transistor has a size that is equal to a size of the second transistor, and the third transistor has a size that is equal to a size of the fourth transistor.

5. The high-side switch circuit according to claim 1, wherein the comparator further comprises:
   a first resistor that is connected between the second end of the first transistor and the first end of the third transistor;
   a second resistor that is connected between the second end of the second transistor and the first end of the fourth transistor; and
   a third resistor that is connected between the second end of the first transistor and the control terminal of the fifth transistor.

6. The high-side switch circuit according to claim 1, wherein the second transistor and the fourth transistor are diode-connected.

7. The high-side switch circuit according to claim 1, wherein the first to fifth transistors are bipolar transistors.

* * * * *